US011313893B2

(12) United States Patent
Miller et al.

(10) Patent No.: US 11,313,893 B2
(45) Date of Patent: Apr. 26, 2022

(54) FAR-FIELD RADIATION PATTERN MEASUREMENTS OF HIGH-FREQUENCY ANTENNAS WITH UNMANNED AERIAL SYSTEMS

(71) Applicant: CALIFORNIA INSTITUTE OF TECHNOLOGY, Pasadena, CA (US)

(72) Inventors: Joshua M. Miller, Pasadena, CA (US); Emmanuel Decrossas, Pasadena, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 629 days.

(21) Appl. No.: 16/112,376

(22) Filed: Aug. 24, 2018

(65) Prior Publication Data
US 2019/0086460 A1  Mar. 21, 2019

Related U.S. Application Data

(60) Provisional application No. 62/560,797, filed on Sep. 20, 2017.

(51) Int. Cl.
*G01R 29/10* (2006.01)
*G05D 1/00* (2006.01)
*G01S 7/40* (2006.01)

(52) U.S. Cl.
CPC ........... *G01R 29/10* (2013.01); *G05D 1/0094* (2013.01); *G01S 7/4004* (2013.01)

(58) Field of Classification Search
CPC .............. G01R 29/10; G05D 1/0094; G01S 7/40–4004
See application file for complete search history.

(56) References Cited

U.S. PATENT DOCUMENTS

| | | | |
|---|---|---|---|
| 10,630,397 B2* | 4/2020 | Howard | G01R 27/28 |
| 2011/0174922 A1* | 7/2011 | Berman | F41H 11/04 244/1 TD |
| 2016/0088498 A1* | 3/2016 | Sharawi | G01R 29/10 370/241 |
| 2016/0269917 A1* | 9/2016 | Hillegas, Jr. | H04W 24/02 |
| 2020/0003817 A1* | 1/2020 | Lvarez | H04B 17/102 |
| 2020/0177029 A1* | 6/2020 | Homma | G01S 13/32 |

OTHER PUBLICATIONS

Federal Aviation Administration, "Balloons Regulations & Policies". Available: https://www.faa.gov/aircraft/air_cert/design_approvals/balloons/balloons_regs/, accessed Nov. 2018.
(Continued)

*Primary Examiner* — Matthew M Barker
(74) *Attorney, Agent, or Firm* — Steinfl + Bruno, LLP

(57) ABSTRACT

An unmanned, automated aerial system is programmed to fly in a set pattern around an antenna. The antenna is supported by a structure on the ground, or attached to an aerostat, according to its operational wavelength, in order to avoid ground effects. The radiation pattern of the antenna under test is measured by an antenna onboard the aerial system. The positional data of both antennas is logged to account for any interference in the measurements due to atmospheric conditions.

8 Claims, 7 Drawing Sheets

(56) References Cited

OTHER PUBLICATIONS

Friis, H.T., "A Note on a Simple Transmission Formula," *Proceedings of the IRE and Waves and Electrons*, 34(5), 254-256, May 1946. 3 pages.

Horner, M., et al. "Europa Mission Configuration Update to Accommodate Maturing Instrument Designs," *IEEE Aerospace Conference*, Mar. 2017.

Lesallen, R., et al. EZNEC Antenna Software [Online]. Available: https://www.eznec.com. Accessed Nov. 2018.

Siripuram, A., et al. "Near-Field HF Antenna Pattern Measurement with Absolute Gain Calibration," *USNC-URSI Radio Science Meeting*, 2016, pp. 91-92. IEEE, Jul. 2016. 3 pages.

* cited by examiner

FAR-FIELD RADIATION PATTERN MEASUREMENTS OF HIGH-FREQUENCY ANTENNAS WITH UNMANNED AERIAL SYSTEMS

CROSS REFERENCE TO RELATED APPLICATIONS

The present application claims priority to U.S. Provisional Patent Application No. 62/560,797, filed on Sep. 20, 2017, the disclosure of which is incorporated herein by reference in its entirety.

STATEMENT OF INTEREST

The invention described herein was made in the performance of work under a NASA contract NNN12AA01C, and is subject to the provisions of Public Law 96-517 (35 USC 202) in which the Contractor has elected to retain title.

TECHNICAL FIELD

The present disclosure relates to radiation measurements. More particularly, it relates to far-field radiation pattern measurements of high-frequency antennas with unmanned aerial systems.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

SUMMARY

Figure 1:
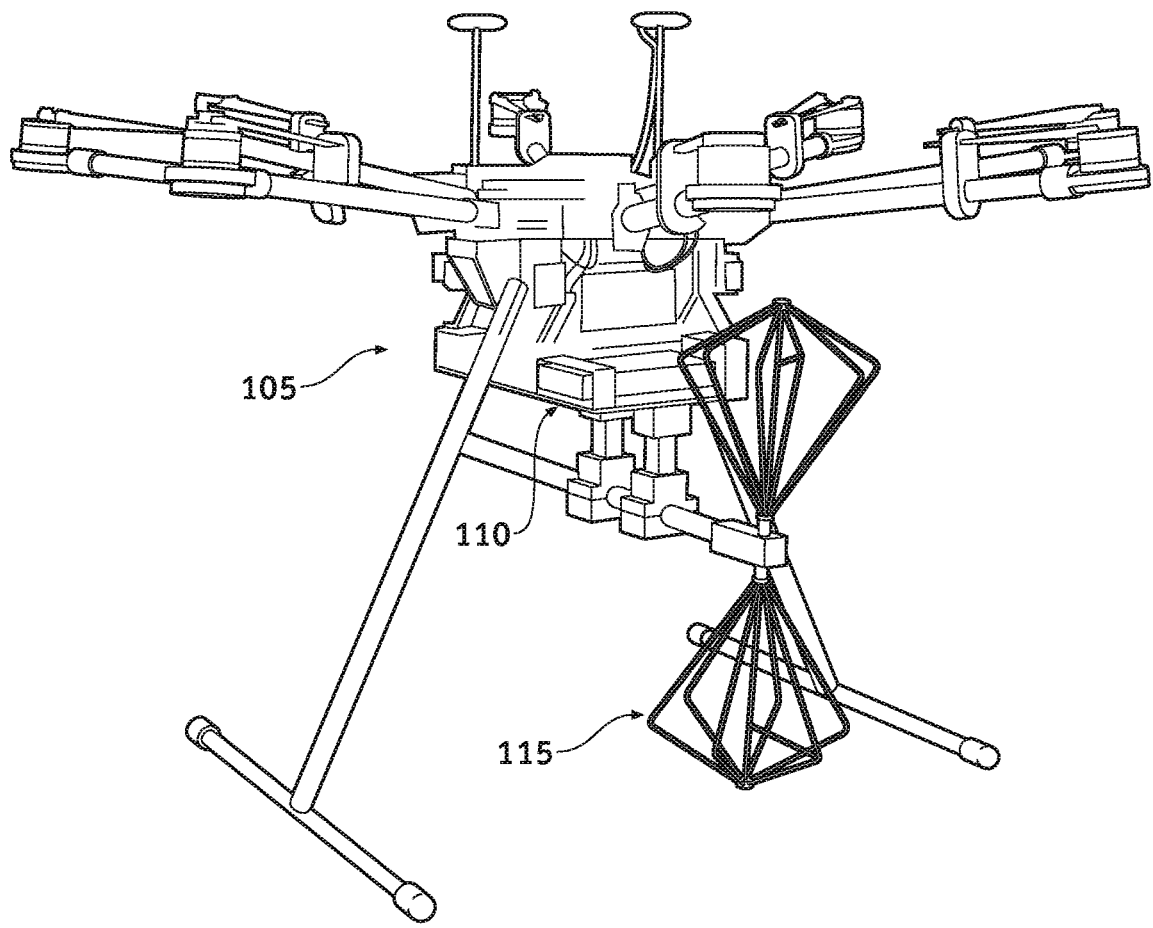
FIG. 1 illustrates an exemplary unmanned vehicle with a measurement package.

In a first aspect of the disclosure, a method is described, the method comprising: providing a first antenna having an operating wavelength; providing an unmanned aerial system, the unmanned aerial system comprising a second antenna; providing a supporting structure for the first antenna, the supporting structure setting the first antenna at a height above ground equal to or greater than three times the operating wavelength; controlling the unmanned aerial system to move between set points of a plurality of set points, the plurality of set points forming a three dimensional pattern around the first antenna; measuring, at each set point of the plurality of set points and by the second antenna, first radiation data emitted by the first antenna; rotating the first antenna by 180°; measuring, at each set point of the plurality of set points and by the second antenna, second radiation data emitted by the first antenna; and generating a radiation pattern of the first antenna based on the first radiation data and the second radiation data.

In a second aspect of the disclosure, a method is described, the method comprising: providing a first antenna having an operating wavelength; providing an unmanned aerial system, the unmanned aerial system comprising a second antenna; detecting a prevalent wind direction; providing a suspending structure for the first antenna, the suspending structure comprising: an aerostat attached to the first antenna and configured to suspend the first antenna at a height above ground; a first tethering line tethering the first antenna vertically to the ground at a first location; and a second tethering line tethering the first antenna laterally to the ground at a second location upwind relative to the first location; controlling the unmanned aerial system to move between set points of a plurality of set points, the plurality of set points forming a three dimensional pattern around the first antenna; measuring, at each set point of the plurality of set points and by the second antenna, first radiation data emitted by the first antenna; and generating a radiation pattern of the first antenna based on the first radiation data.

DETAILED DESCRIPTION

The present disclosure describes methods to perform near free space, far-field radiation pattern measurements of high frequency (HF) antennas, using small unmanned aerial systems (sUAS) and helium-filled aerostats or balloons. For example, these methods can be used to measure the radiation patterns of the radar antennas onboard NASA's Europa Clipper mission to Europa, one of Jupiter's moons. Adapted from land-based measurements, the test methodology described herein involves hoisting the antenna to be tested above the earth, to minimize ground interactions, while flying a sUAS with an onboard measurement package to map the far field radiation pattern of the antenna. The methods can also be used to measure radiation pattern maps of fixed very high frequency (VHF) antennas. As known to the person of ordinary skill in the art, the HF band is between 3 and 30 MHz, while the VHF band is between 30 and 300 MHz.

It is notoriously difficult to perform free-space measurements and three dimensional far-field radiation pattern measurements of HF antennas, due to their physically large size and electrically large wavelengths of operation. Because of these characteristics, typical measurement techniques for antennas in the (VHF) band and higher, such as anechoic chamber pattern mapping and isolation room measurements, are precluded from use in most cases. Computer simulations using electromagnetic modeling software and non-free-space measurements (i.e. over a metallic ground plane with well-known characteristics) are often performed in lieu of a near free space measurement that an anechoic chamber may imitate.

As an example of antennas that can be characterized by the methods of the present disclosure, a space mission antenna is described in the following: radar for Europa assessment and sounding: ocean to near-surface (REASON), which is a dual-band sounding radar operating at 60 MHz with a 9 MHz primary science payload. REASON is onboard the Europa Clipper mission prepared by the Jet Propulsion Laboratory (JPL) to map ice coverage of the surface of Europa. For each band of operation, dipole arrays are used for both the transmitting and receiving antennas. In order to fill the gap in measurement capabilities for 9 MHz HF antennas, the Jet Propulsion Laboratory has developed new techniques for antenna measurements, as described herein. By making use of helium-filled aerostats and autonomous, unmanned aircraft with calibrated radio frequency (RF) measurement equipment, near free space measurements of HF antennas at an outdoor test range can be performed. With the advent and evolution of amateur sUAS aircraft, it is now possible to assemble a cost-effective autonomous aircraft with radio frequency (RF) sensors to perform accurate, airborne measurements. As a way of example of the type of antennas that can be measured with the methods of the present disclosure, two different dipole antennas are considered: a half-wavelength 60 MHz dipole antenna, and a half-wavelength 9 MHz dipole antenna, with the main technique development focused on the 9 MHz antenna. The person of ordinary skill in the art will understand that the methods can also be applied to other antennas having different operating frequencies.

For the preliminary development of the test technique, two electrically similar, but non-flight ready, half-wave dipole antennas were initially tested. The 60 MHz antenna for this initial test is a fixed element, half-wavelength dipole 2.1 m in length, while the 9 MHz antenna is a flexible wire, half-wavelength dipole 16 m in length. FIG. 1 illustrates an exemplary unmanned vehicle (105) comprising rotors to generate lift, and a measurement package (110). The sUAS used for this measurement technique can be, for example, an octocopter, a commercial off the shelf platform that has onboard navigation and autopilot-capable avionics. The sUAS carries an independently powered measurement payload that consists of a computer, a spectrum analyzer, and a calibrated, wideband HF/VHF biconical measurement antenna (115). The sUAS as shown in FIG. 1 also contains GPS receivers for tracking its position, as well as for generating stable reference signals for the RF equipment, a barometer for altitude measurements, and a gyroscope. The antenna (115), in this embodiment, is a biconical dipole antenna.

While the primary purpose of developing the airborne measurement system is to enable characterization of HF antennas, the system performance can at first be analyzed by using a fixed antenna on the ground. It is nearly impossible to get near-free space ground-based measurements of the 9 MHz dipole without interaction from the Earth and other nearby objects, due to the separation distance required. The 60 MHz dipole can be measured using both traditional measurement techniques which provide a known baseline measurement to verify operation of the sUAS system before measuring the 9 MHz dipole using the helium aerostat.

Figure 2:
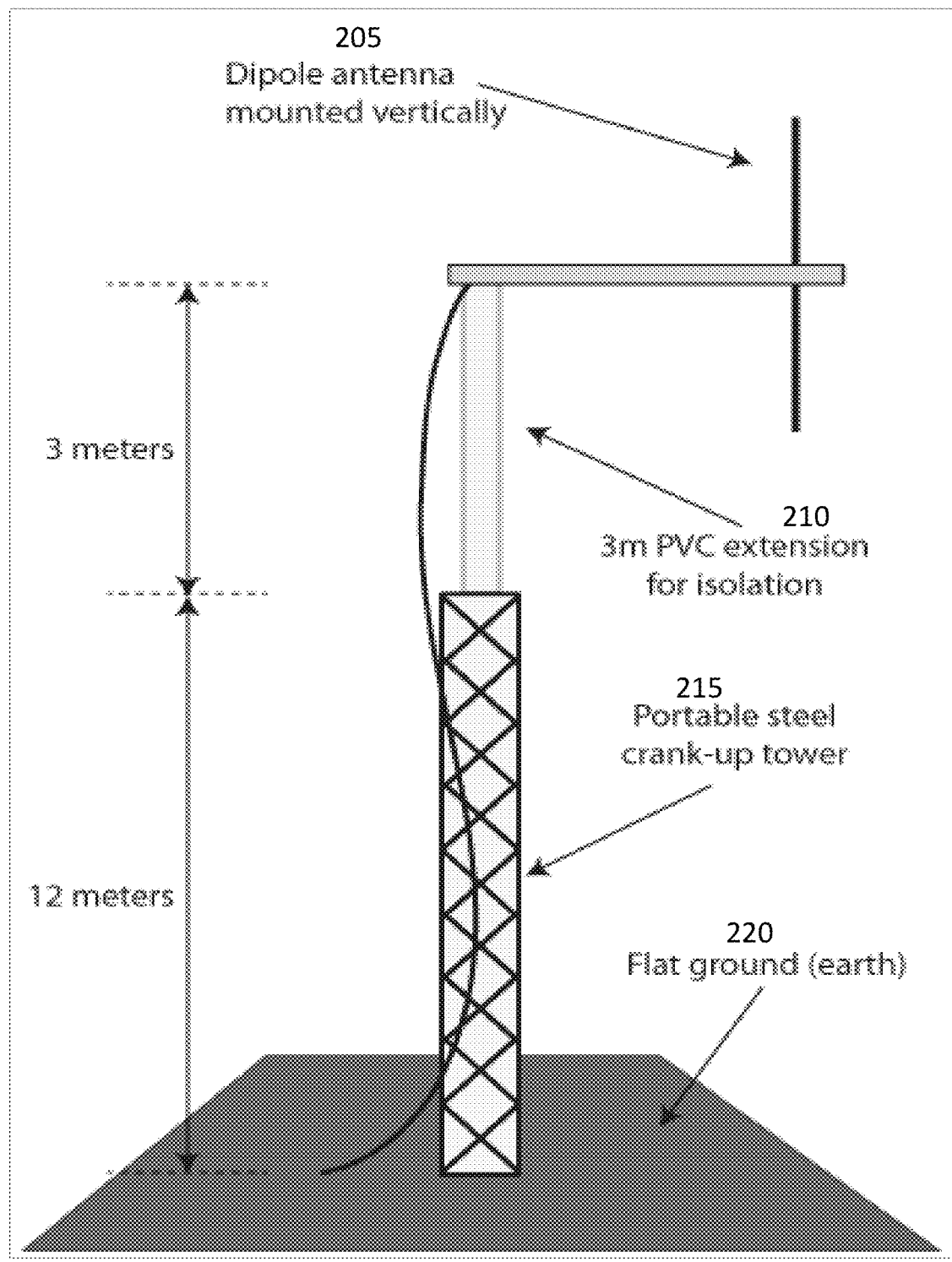
FIG. 2 illustrates a mounting configuration for a VHF dipole antenna.

To characterize the 60 MHz dipole, the antenna was placed on a fixed tower 15 m (three times the wavelength $\lambda$) above the ground and isolated from the metal tower below by a 3 m section of non-metallic pipe, e.g. a PVC pipe. The antenna was mounted in a vertically polarized orientation to position the null of the antenna towards the ground. FIG. 2 illustrates a dipole antenna mounted in a vertical configuration (205), with a PVC extension for isolation (210), and a portable crank-up steel tower (215) elevating the antenna from the ground level (220). In this example, the steel tower extends 12 meters, while the PVC section extends 3 meters.

To determine how the height affects the radio frequency (RF) antenna performance, a software was used to model the radiation pattern and impedance of the antenna at increasing heights above the ground, as described in Ref [3]. An elevation of 15 meters is the height where ground effects should no longer be seen in the impedance value. The 15 meters value is found by converting the value expected in free space.

The antenna was connected to a signal generator on the ground, producing an unmodulated tone at 60 MHz with a 0 dBm output power. The Friis transmission, Eq. (1) reproduced below from Ref [3], is used to estimate the worst-case received power at the sUAS spectrum analyzer using a 0 dBm transmission power. A "worst case" scenario is when both the antenna under test and the measuring antenna are aligned at the anticipated maximum gain. A base-10 logarithm is applied and the equation rearranged as in Eq. (2), to allow values to be added and subtracted as decibel (dB) ratios instead of absolute wattage values.

$$\frac{P_r}{P_t} = \left(\frac{\lambda}{4\pi R}\right)^2 G_r G_t \tag{1}$$

$$P_r = P_t + G_r + G_t + 20\log\left(\frac{\lambda}{4\pi R}\right) \tag{2}$$

Using Eq. (2) with values P=0 dBm, $\lambda$=5 m, R=15 m, $G_r$=0 dBi, and $G_t$=2 dBi for a standard dipole, the resulting received power at the sUAS spectrum analyzer is −29.5 dBm. This value is below the maximum input to the analyzer, ensuring a measurement that is not saturating the receiver. With the noise floor around −90 dBm, this provides about 60 dB of signal-to-noise ratio (SNR) and dynamic range for measurements.

Figure 3:
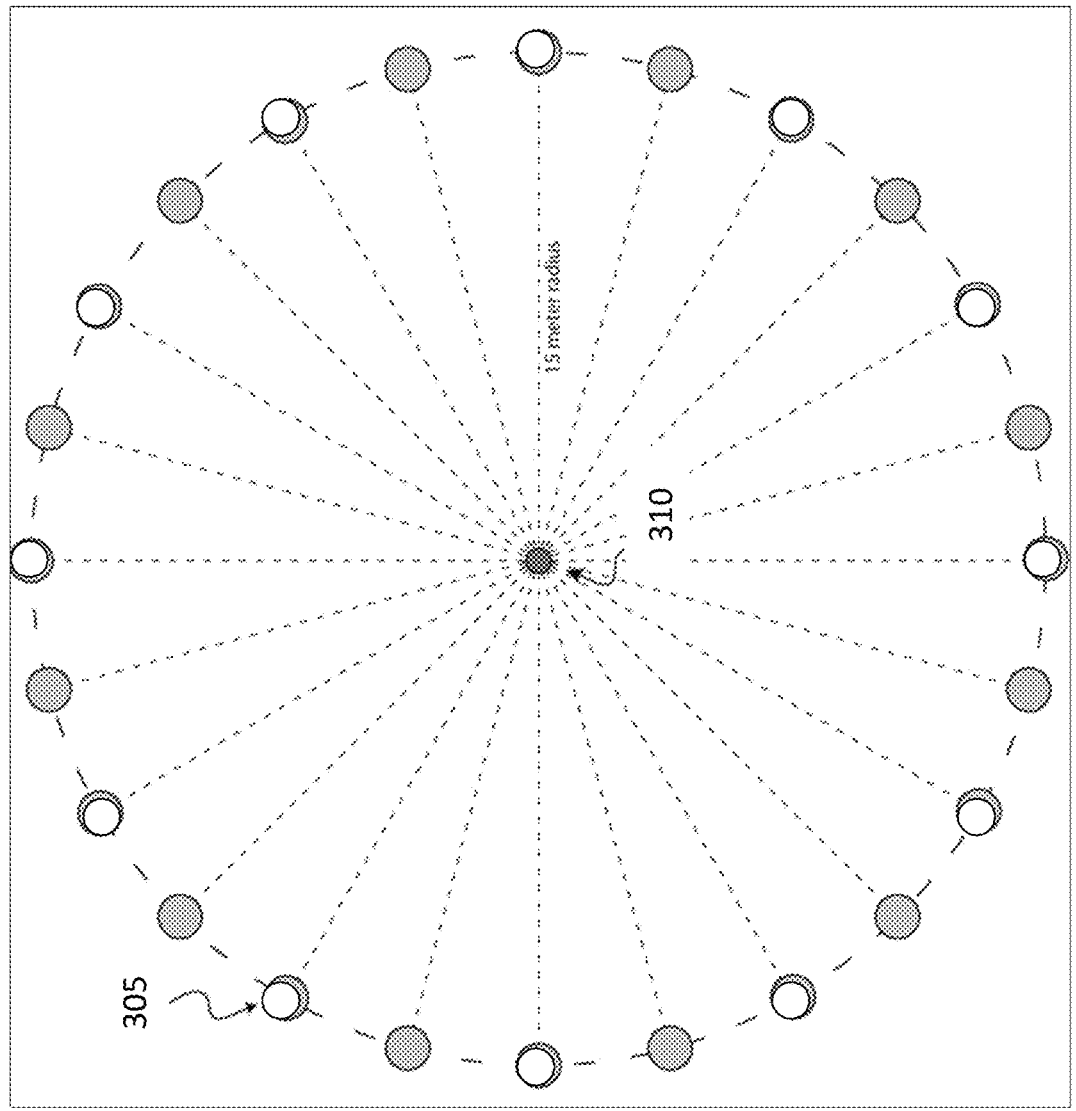
FIG. 3 illustrates an azimuth cut at 0° elevation of a sUAS flight path with 15° point spacing around the fixed VHF antenna.
Figure 4:
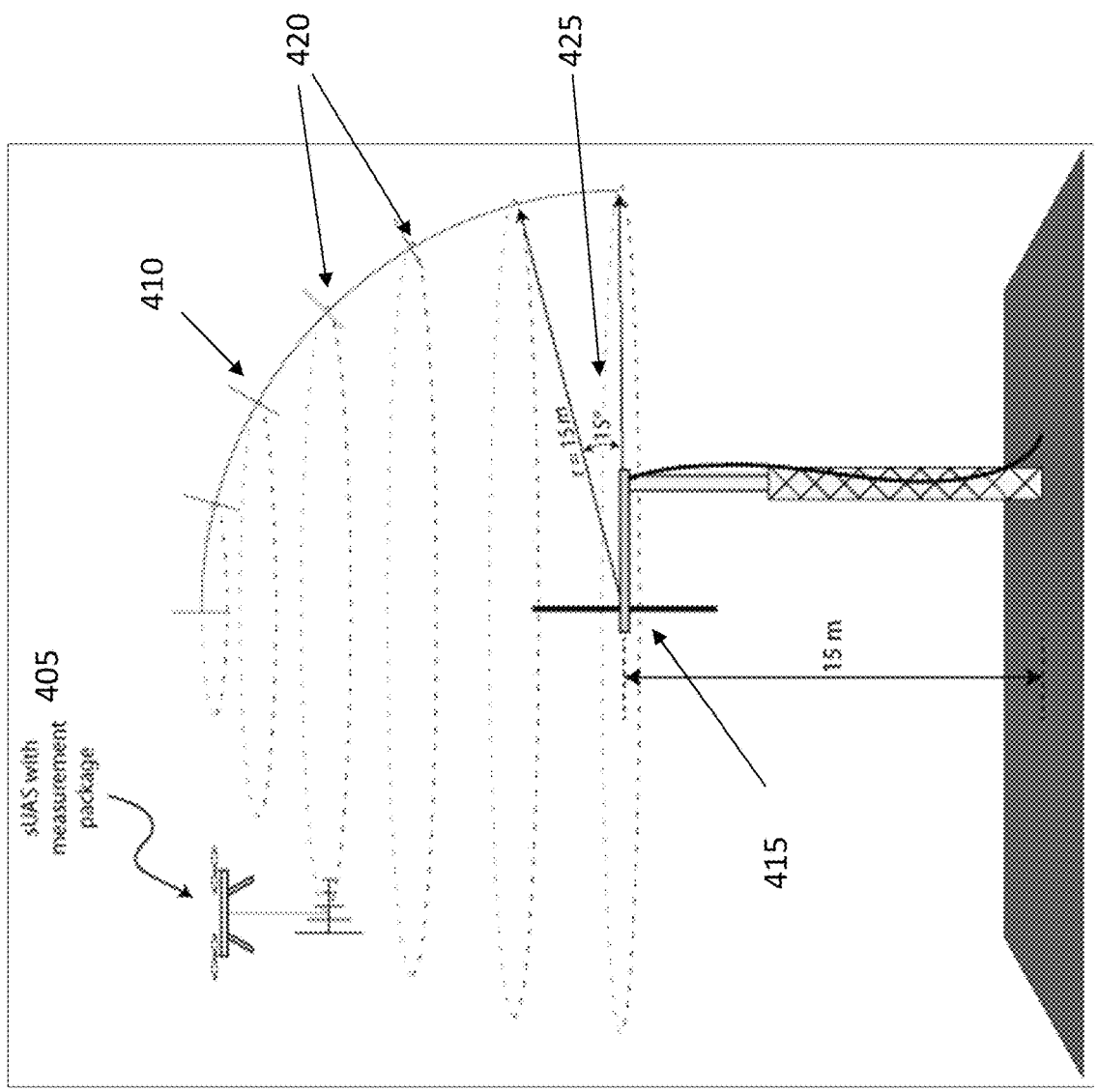
FIG. 4 illustrates a three dimensional depiction of a hemispherical sUAS flight path around a fixed VHF antenna.

The global positioning system (GPS) coordinates of the center of the antenna under test are captured, and a flight plan developed for the sUAS. The flight plan is executed by the autopilot onboard the sUAS. The flight plan consists of a half-sphere of points spaced 15° in both elevation and azimuth, centered about the location of the antenna under test. The sUAS is programmed to fly to each elevation level and complete a full 360° circle at that elevation, before proceeding to the next level. Each elevation plane has 24 points spaced 15° apart. The sUAS logs received power and GPS position at each measurement point, to create a three-dimensional signal strength map with 145 total measurement points per half sphere. This exemplary method is illustrated in FIGS. 3 and 4. During flight, the sUAS maintains the position of the measuring antenna towards the antenna under test, at each measurement point. The measurement antenna onboard the sUAS was positioned vertically to measure co-polarized performance.

In other embodiments, the pattern used to position the sUAS at different points can be varied, and does not need to form a hemispherical pattern with a 15° spacing. For example, a different angular spacing may be used, more or less than 15°. In the example of FIG. 3, the measurement sphere of locations at which the sUAS is programmed to stop can be cut in adjacent circles of variable radius. The sUAS can complete a measurement circle, then change elevation to perform another circular measurement at set points, and continue the circular measurements until the hemispherical pattern has been completed. In the example of FIG. 3, the measurement points (305) are spaced 15° apart, and 15 meters away from the antenna under test (310). In the example of FIG. 4, the sUAS (405) is carrying out a measurement in a hemispherical pattern (410), to test the antenna (415). The adjacent circular levels (420) are spaced apart, in this example, by 15° (425). However, different angles may be used to separate the levels forming the hemispherical pattern (410).

Once a half-sphere flight plan is completed, the antenna tower is lowered and the antenna is rotated 180° to capture the pattern of the other half. The measurement procedure is therefore repeated after rotating the antenna. The sUAS cannot fly under the antenna due to the presence of the supporting structure, thus requiring the rotation of the antenna to measure its full radiation characteristics.

Figure 5:
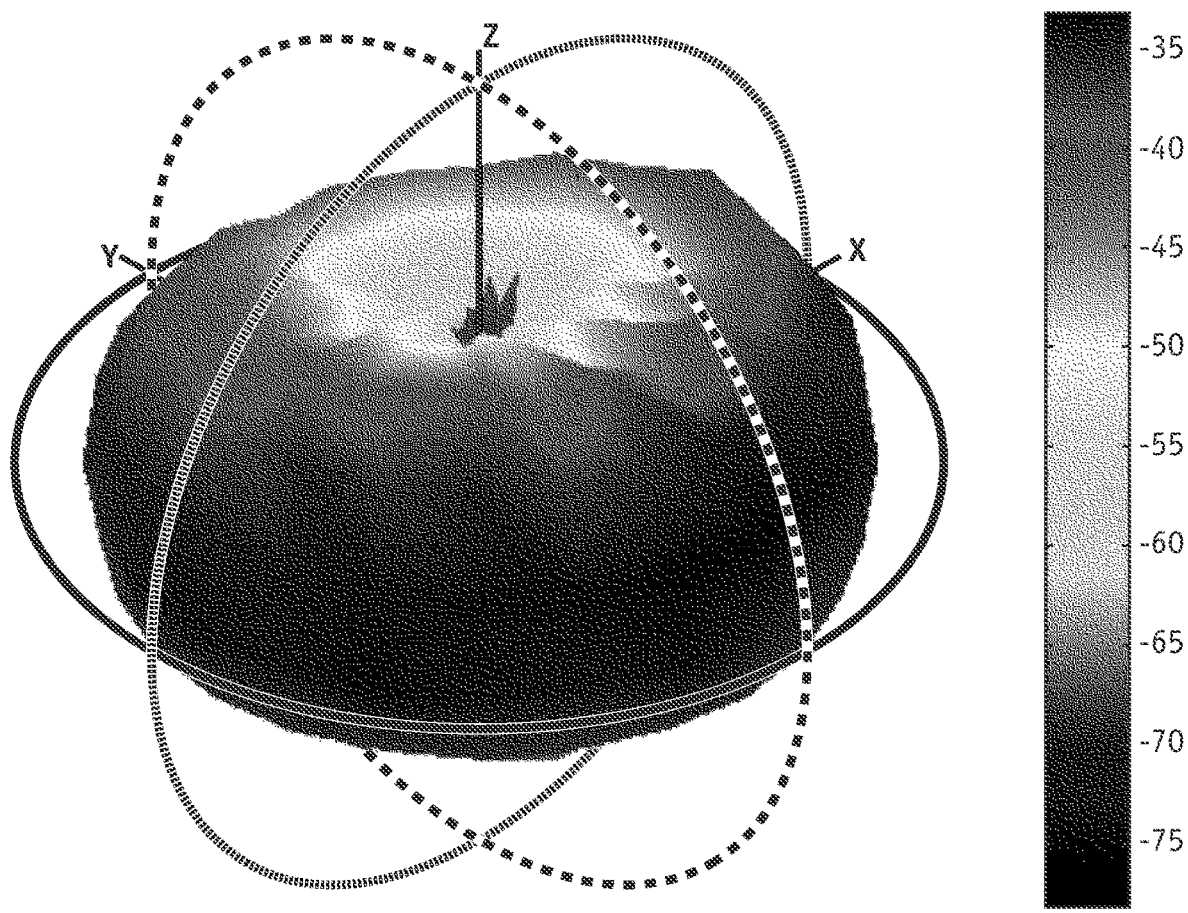
FIG. 5 illustrates the vertical polarization (co-polarization) signal strength mapping of a 60 MHz dipole measured with a sUAS.

The measured signal strengths for the above example were compiled, along with positions logged during flight, and plotted as illustrated in FIG. 5. FIG. 5 indicates that the 60 MHz dipole measurements are consistent with the expected results, with the maximum signal measured being around −32 dBm.

Characterization of the far-field radiation pattern of the HF antenna is generally the same process used for the VHF antenna, as described above in the present disclosure. Due to the wavelength (λ) of 9 MHz (33 m), effects on the RF antenna performance are minimized, approaching free space behavior, only at approximately 100 m (3λ) in elevation above ground. It is possible to perform near-field pattern mapping near the ground at these frequencies with a calibrated ground plane, as described in Ref [4]. However, the effects from the ground plane must still be de-embedded from the results, and the ground plane presence makes a near free space impedance measurement difficult. The testing of the 9 MHz antenna can instead be carried out with the sUAS measurement platform, to collect radiation pattern data, and a helium aerostat platform to hoist the antenna above ground. Using an aerostat to lift the antenna under test minimizes ground interaction and allows near free space measurements.

The exemplary aerostat selected for hoisting the 9 MHz antenna assembly is approximately 8 m in diameter and 3 m in height. It uses 93 m³ of helium to provide approximately 65 kg of payload lift. The airfoil is made of 152 μm (6 mils) urethane with 300 meters of non-conductive Kevlar™ tether cord. All components of the aerostat, minus attachment points for tethers, are non-conductive to limit interaction with the antenna. Other, similar, aerostats may also be used to carry out the same measurement procedure.

Figure 6:
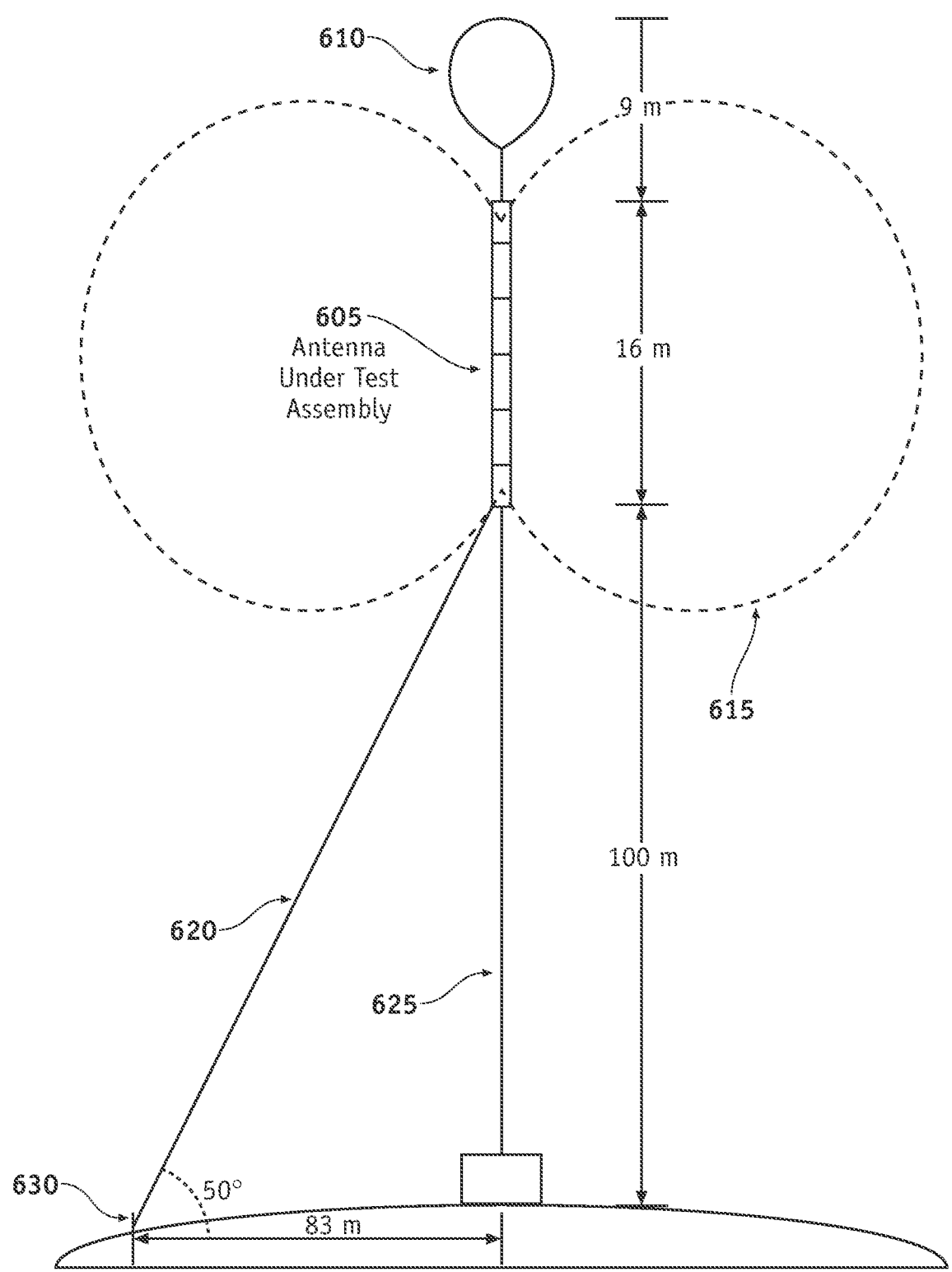
FIG. 6 illustrates an antenna assembly configuration with an aerostat.

As illustrated in FIG. 6, the 9 MHz antenna (605) is suspended vertically under the aerostat (610) to orient the null of the antenna pattern towards the ground and towards the aerostat above. The antenna is kept in position by a support structure (630) that hangs independently of the aerostat tether line (625), keeping the antenna hanging vertically if the aerostat (610) is flying downwind of the tether point on the ground. The support structure (630) is placed upwind of the aerostat (610) and tethers the antenna (605) with a support line (620). FIG. 6 also illustrates the expected radiation pattern (615), which allows preparation of the flight pattern of the sUAS to test and confirm any modifications from the expected radiation pattern.

The dipole was modeled as described in Ref [2] over a ground plane. Through the computer simulations, it was determined that a minimum altitude of approximately 100 m was necessary to diminish ground effects on the antenna impedance. The top of the aerostat can be kept under a 150 m (500 ft) altitude as this is the maximum altitude that a tethered or moored balloon can be flown without special authorization from the Federal Aviation Administration.

A standalone transmitter and vector network analyzer (VNA) are housed onboard the antenna support structure in a custom hard-sided transport case. In this example, the equipment case is battery powered and houses a wireless access point (WAP) for remote control via a wireless link back to the ground. The transport case is mounted at the center of the antenna near the feed point, to minimize the coaxial cable run to the signal source feeding the antenna. This setup was chosen to prevent having to run control cables back down to the ground, which may interact and couple with the antenna under test, altering the test results. The equipment enables calibrated $S_{11}$ measurements and provides a stable 9 MHz transmitter source for far-field radiation pattern mapping.

The measuring equipment houses a microcontroller that interfaces with a GPS receiver and three-axis inertial measurement unit (IMU) containing a gyroscope, accelerometer, and magnetometer. These parameters are logged continuously during flight for post-processing, to track and correct any movement which may affect signal measurements, such as swaying of the antenna or aerostat that may produce polarization mismatches.

The embedded signal generator is connected to a small amplifier, producing +13 dBm of output power at 9 MHz to the antenna under test. Using Eqs. (1) and (2) as part of the same process for the VHF antenna, this additional power requirement was determined because of the reduced sensitivity of the receiving antenna at HF frequencies. Using the parameters from the HF antenna test flight plan for Eqs. (1) and (2), a maximum received signal strength of −31 dBm is expected, also providing approximately 60 dB of SNR for measurements at 9 MHz.

The flight plan for the aerostat setup is a cylindrical pattern of points, unlike the spherical mapping performed with the VHF antenna. The sUAS cannot fly directly under the aerostat because of tether lines and cannot fly over the aerostat due to maximum height restrictions by the government on sUAS flights. Therefore, in some embodiments a cylindrical pattern can be used, instead of a hemispherical pattern. However, the shape of the pattern may be varied according to the application.

Figure 7:
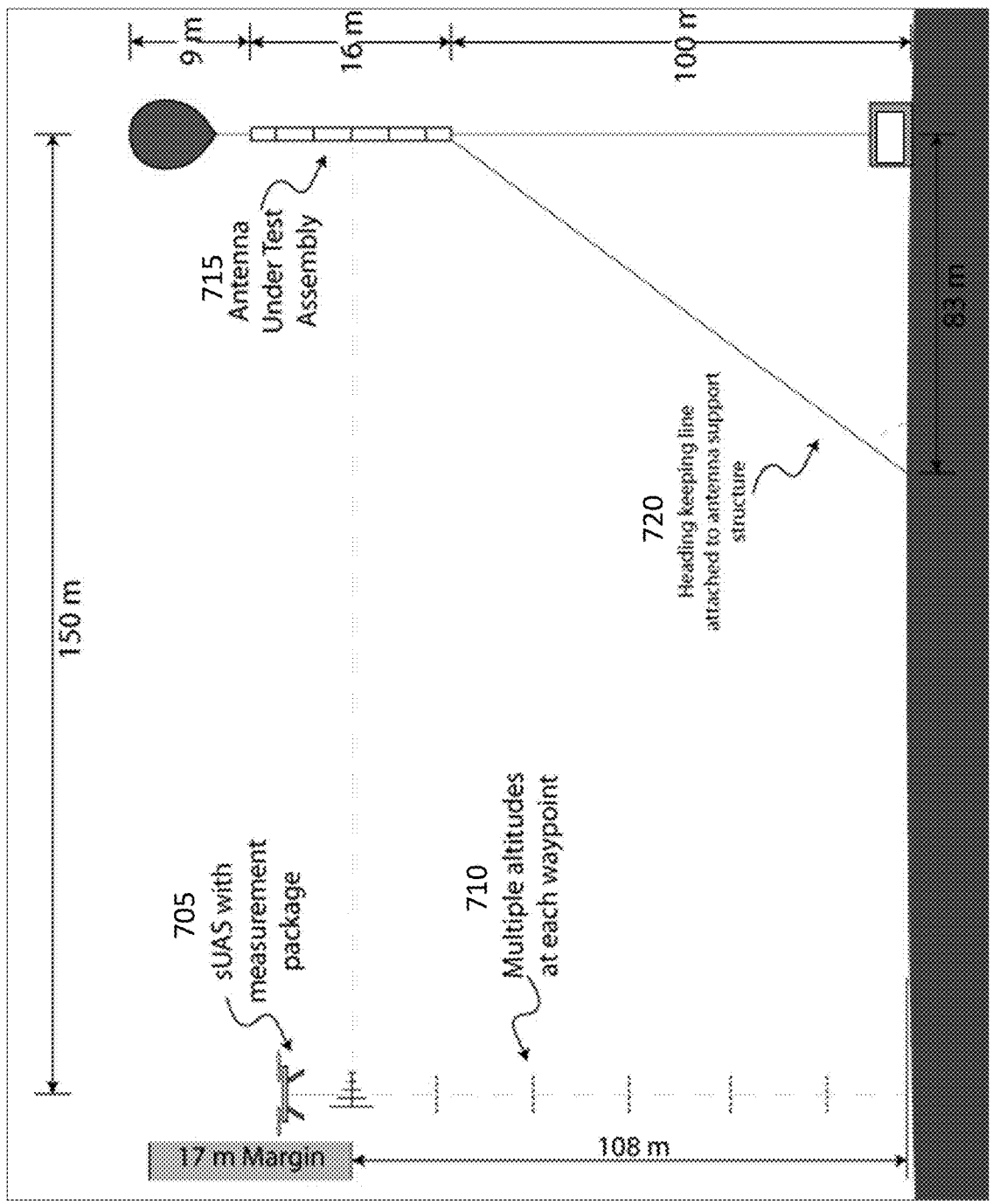
FIG. 7 illustrates the configuration of an aerostat with sUAS parameters.

FIG. 7 illustrates a sUAS with a measuring package (705) flying at different, set altitudes (710), to measure the radiation pattern of the antenna under test (715), which is lifted by an aerostat and tethered to the ground at two locations, including a location upwind (720). The sUAS can be programmed to fly in a cylindrical pattern, for example by completing a circular scan at different altitudes. In some embodiments, instead of using a 15° separation angle between waypoints, as in FIG. 3, an angle of 30° may be used instead. Other angles may also be used, according to the desired number of points. For the aerostat measurement, a distance between the sUAS and the antenna may be, for example, 150 m.

In the aerostat method, measurements are taken approximately 10 times further away than the beginning of the far field. The beginning of the far field has been determined using Eq. (3) with an antenna length D of 16 m, and wavelength of operation λ, of 33.3 m. Eq. (3) thus gives a far field distance R of 15.37 m. However, Eqs. (4) and (5) must also be met.

$$R = \frac{2D^2}{\lambda} \quad (3)$$

$$R \gg D \quad (4)$$

$$R \gg \lambda \quad (5)$$

With the measurement distance of 150 m set as the numerical value for R, Eqs. (2) and (3) are satisfied with R being approximately 10 times larger than D, and 5 times larger than λ, at 33.3 m. The main interest in mapping the radiation pattern of the HF antenna is focused on determining the gain and roll off characteristics of the central null of the radiation pattern. Therefore, elevation cuts can be measured in 30° increments around the antenna. The sUAS is taking measurements at the same elevation of the center of the antenna, and then in 5 m increments down to ground level in a vertical column. This measurement is repeated around the antenna assembly, keeping it at the center of the circular pattern.

Although every effort is made to monitor weather patterns, and perform testing when the most ideal conditions are available, it can happen that during testing local winds may vary, leading to movements in the aerostat platform and drifting for the sUAS. During flight, all positional data, such as roll, pitch, yaw, latitude, longitude, and altitude, are being constantly logged for further analysis in post processing. It is anticipated that during post processing, positional data from both the aerostat and sUAS can be used to account for polarization mismatch losses. Polarization mismatch losses can occur when the measurement antenna and the antenna under test are angled with respect to each other, due to winds. It is also anticipated that corrections to the measured data can be made using positional data from both the aerostat and sUAS, for unexpected variations in relative position during a measurement. For example, recording of a measurement point can be off target due to a wind gust. This error can be corrected by logging the positions of both antennas.

The sUAS antenna far-field measurement system described in the present disclosure is a viable option for ground-based, low frequency antennas, and for performing airborne far-field pattern measurements of an HF antenna. If error sources are managed and accounted for during the measurement process, accuracy can be maintained.

In some embodiments, the aerial system comprises a propulsion system, such as for example a plurality of rotors, a battery to sustain flight and power the onboard electronics, and the measurement package comprising an antenna.

In some embodiments, the present disclosure describes a method comprising: providing a first antenna having an operating wavelength; providing an unmanned aerial system, the unmanned aerial system comprising a second antenna; providing a supporting structure for the first antenna, the supporting structure setting the first antenna at a height above ground equal to or greater than three times the operating wavelength; controlling the unmanned aerial system to move between set points of a plurality of set points, the plurality of set points forming a three dimensional pattern around the first antenna; measuring, at each set point of the plurality of set points and by the second antenna, first radiation data emitted by the first antenna; rotating the first antenna by 180°; measuring, at each set point of the plurality of set points and by the second antenna, second radiation data emitted by the first antenna; and generating a radiation pattern of the first antenna based on the first radiation data and the second radiation data.

The three dimensional pattern can be hemispherical and comprise a plurality of circles, each circle of the plurality of circles having an increasing radius for a decreasing height above ground, each circle of the plurality of circles comprising set points of the plurality of set points spaced apart by a set angle. The set angle can be 15°. The unmanned aerial system can comprise rotors and a global positioning system, and be programmed to follow a flight plan, the programming comprising moving the unmanned aerial system between the set points of the plurality of set points, and pausing at each set point of the plurality of set points to allow measuring the first and second radiation data. The operating wavelength for HF antennas corresponds to an operating frequency between 3 and 30 MHz.

In some embodiments, the supporting structure comprises at least one non-metallic section adjacent to the first antenna, to prevent interference with the first antenna. The methods of the present disclosure can also comprise: logging positions of the unmanned aerial system based on the global positioning system; detecting spatial differences between logged positions and programmed set points; and correcting the radiation pattern based on the spatial differences. The height above ground for HF antennas can be at least 15 meters.

In some embodiments, for VHF antennas in particular, the methods of the present disclosure can comprise: providing a first antenna having an operating wavelength; providing an unmanned aerial system, the unmanned aerial system comprising a second antenna; detecting a prevalent wind direction; providing a suspending structure for the first antenna, the suspending structure comprising: an aerostat attached to the first antenna and configured to suspend the first antenna at a height above ground; a first tethering line tethering the first antenna vertically to the ground at a first location; and a second tethering line tethering the first antenna laterally to the ground at a second location upwind relative to the first location; controlling the unmanned aerial system to move between set points of a plurality of set points, the plurality of set points forming a three dimensional pattern around the first antenna; measuring, at each set point of the plurality of set points and by the second antenna, first radiation data emitted by the first antenna; and generating a radiation pattern of the first antenna based on the first radiation data.

The three dimensional pattern can be cylindrical and comprise a plurality of circles having a same diameter and a different height above ground, each circle of the plurality of circles comprising set points of the plurality of set points spaced apart by a set angle. The set angle can be 30°. The unmanned aerial system can comprise rotors and a global positioning system, and be programmed to follow a flight plan, the programming comprising moving the unmanned aerial system between the set points of the plurality of set points, and pausing at each set point of the plurality of set points to allow measuring the first radiation data.

The operating wavelength can correspond, for VHF antennas, to an operating frequency between 30 and 300 MHz. The aerostat can be a balloon filled with He. The methods of the present disclosure can further comprise: logging positions of the unmanned aerial system based on the global positioning system; detecting spatial differences between logged positions and programmed set points; and correcting the radiation pattern based on the spatial differences. The height above ground can be equal to or greater than three times the operating wavelength. For VHF antennas, the height above ground can be at least 100 meters.

The examples set forth above are provided to those of ordinary skill in the art as a complete disclosure and description of how to make and use the embodiments of the disclosure, and are not intended to limit the scope of what the inventor/inventors regard as their disclosure.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

The references in the present application, shown in the reference list below, are incorporated herein by reference in their entirety.

REFERENCES

[1] M. Homer, A. Eremenko, and M. Gentile, "Europa Mission Configuration Update to Accommodate Maturing Instrument Designs," IEEE Aerospace Conference, March 2017.
[2] R. Lewallen, S. Lewallen. (2017, August). *EZNEC Antenna Software* [Online]. Available: https://www.eznec.com
[3] H. T. Friis, "A Note on a Simple Transmission Formula," *Proceedings of the IRE*, vol. 34, no. 5, pp. 254-256, May 1946.
[4] A. Siripuram, M. Daly, "Near-Field HF Antenna Pattern Measurement with Absolute Gain Calibration," USNC-URSI Radio Science Meeting, July 2016.

What is claimed is:

1. A method comprising:
providing a first antenna having an operating wavelength;
providing an unmanned aerial system, the unmanned aerial system comprising a second antenna;
detecting a prevalent wind direction;
providing a suspending structure for the first antenna, the suspending structure comprising:
an aerostat attached to the first antenna and configured to suspend the first antenna at a height above ground;
a first tethering line tethering the first antenna vertically to the ground at a first location; and
a second tethering line tethering the first antenna laterally to the ground at a second location upwind relative to the first location;
controlling the unmanned aerial system to move between set points of a plurality of set points, the plurality of set points forming a three dimensional pattern around the first antenna;
measuring, at each set point of the plurality of set points and by the second antenna, first radiation data emitted by the first antenna; and
generating a radiation pattern of the first antenna based on the first radiation data, wherein the unmanned aerial system further comprises rotors and a global positioning system;
logging positions of the unmanned aerial system based on the global positioning system;
detecting spatial differences between logged positions and programmed set points;
correcting the radiation pattern based on the spatial differences; and
programming the unmanned aerial system to follow a flight plan, the programming comprising:
moving the unmanned aerial system between the set points of the plurality of set points, and
pausing at each set point of the plurality of set points to allow measuring the first radiation data.

2. The method of claim 1, wherein the three dimensional pattern is cylindrical.

3. The method of claim 2, wherein the three dimensional pattern comprises a plurality of circles having a same diameter and a different height above ground for each circle of the plurality of circles, each circle of the plurality of circles comprising set points of the plurality of set points spaced apart by a set angle.

4. The method of claim 3, wherein the set angle is 30°.

5. The method of claim 1, wherein the operating wavelength corresponds to an operating frequency between 30 and 300 MHz.

6. The method of claim 1, wherein the aerostat is a balloon filled with He.

7. The method of claim 1, wherein the height above ground of the first antenna is equal to or greater than three times the operating wavelength.

8. The method of claim 1, wherein the height above ground of the first antenna is at least 100 meters.

* * * * *